United States Patent [19]

Kawagoe

[11] 3,953,744

[45] Apr. 27, 1976

[54] CIRCUIT FOR CONVERTING AN ASYNCHRONOUS SIGNAL WITH A LONG TRANSITION TIME TO A SYNCHRONIZED SIGNAL

[75] Inventor: Hiroto Kawagoe, Kodaira, Japan

[73] Assignee: Hitachi, Ltd., Japan

[22] Filed: Jan. 14, 1974

[21] Appl. No.: 432,835

[30] Foreign Application Priority Data
  Jan. 12, 1973  Japan.................................. 48-5978

[52] U.S. Cl............................. 307/208; 307/205; 307/215; 307/268; 307/269; 328/63
[51] Int. Cl.²..................... H03K 19/08; H03K 5/13
[58] Field of Search........... 307/205, 208, 215, 268, 307/269, 290, 291; 328/63, 206

[56] References Cited
UNITED STATES PATENTS

| | | | |
|---|---|---|---|
| 3,225,301 | 12/1965 | McCann | 307/269 |
| 3,488,478 | 1/1970 | Gilbert | 307/208 |
| 3,612,900 | 10/1971 | Davies | 307/269 |
| 3,764,911 | 10/1973 | East | 307/268 |
| 3,778,794 | 12/1973 | Szabo | 307/271 |
| 3,800,168 | 3/1974 | Cochran | 307/290 |
| 3,812,388 | 5/1974 | Southworth | 307/208 |

*Primary Examiner*—Stanley D. Miller, Jr.
*Attorney, Agent, or Firm*—Craig & Antonelli

[57] ABSTRACT

A synchronizer circuit comprises a Schmitt trigger circuit which sharpens the rise or fall of an asynchronous input signal, and a clocked flip-flop circuit which converts the asynchronous signal having the sharpened waveform into a synchronous signal. In another embodiment, complementary asynchronous input signals having a large transition time are supplied to an RS flip-flop circuit in a first repeated interval in synchronism with a first clock pulse. Then, the state of the flip-flop is caused to remain stable in the other intervals. Subsequently, the output of the flip-flop is read out in synchronism with a second clock pulse by a transfer-gate field effect transistor. Thus, the asynchronous input signal is converted to a waveform-shaped and synchronized signal.

4 Claims, 4 Drawing Figures

3,953,744

CIRCUIT FOR CONVERTING AN ASYNCHRONOUS SIGNAL WITH A LONG TRANSITION TIME TO A SYNCHRONIZED SIGNAL

BACKGROUND OF THE INVENTION

The present invention relates to a synchronizer circuit and is directed to, for example, a synchronizer circuit which converts an asynchronous signal from the rotary drum or the like of an electronic deck calculator with a printer into a synchronous signal.

In an electronic desk calculator, etc., information processing, such as calculations, is carried out using regular synchronous signals (clock pulses). That is, signals shifting through various logic parts of the calculator are mostly synchronized with the clock pulses. Where a printer is used as the means to indicate set numbers, a calculated result, etc., information must be transmitted from the body of the calculator to the printer in conformity with the movement of the printer. In other words, the information must be transmitted in synchronism with the movement of the printer.

The general printer has a rotary drum in which a plurality of numerals and letters are carved, and the printer side accordingly requires that the movement of the drum (what numeral or letter has moved under an electromagnetic hammer) be connected into an electric signal and that the electric signal be sent to the calculator body.

The electric signal thus sent from the printer must be converted into a signal synchronized with the clock pulse, in order that it may be subjected to logical operations, such as an AND operation and an OR operation, with the aforesaid signals being processed through the various logic parts of the calculator body. The synchronism herein stated is different in meaning from the foregoing synchronism between the calculator and the drum, and in this respect, care for avoiding the confusion of both will be necessary.

The signal sent from the printer is generally inferior with respect to the rise and fall (sharpness) of the waveform, and the period during which it transmits between two levels is very long.

Accordingly, when this signal is fed into the logical circuit of the calculator without any change, the logical circuit remains in the transition region of its input-output transmission characteristic for a long period, and the state in which the output level is determined neither as a logical 1 nor as a logical 0 continues for a long period of time.

Since, in this manner, the signal generated in the printer does not have good rising and falling (sharpness) characteristics, it has been unreasonable to convert it into the synchronous signal immediately.

The present invention has been made in order to solve the problem stated above, and provides a circuit which converts an asynchronous signal having inferior rising and falling characteristics into a synchronous signal having good rising and falling characteristics.

In uses such as the electronic desk calculator, more importance is attached to power consumption and the degree of integration than to speed, and as means for fulfilling this purpose, there is the insulated gate field-effect transistor semiconductor integrated circuit, and such integrated circuit is chiefly used at present.

It is, accordingly, another object of the present invention to provide a synchronizer and converter circuit which is constructed of insulated gate field-effect transistors.

Hereunder, the present invention will be concretely described in connection with embodiments with reference to the accompanying drawings.

FIGS. 1 and 2a – 2c illustrate embodiments according to the present invention, in which FIG. 1 is a block diagram of a synchronizer circuit utilizing a Schmitt trigger circuit;

FIG. 2a is a block diagram of a logical circuit;

FIG. 2b is a timing diagram illustrating the operation of the circuit of FIG. 2a; and FIG. 2c is a diagram of the circuit of FIG. 2a composed of MISFETs.

Figure 1:
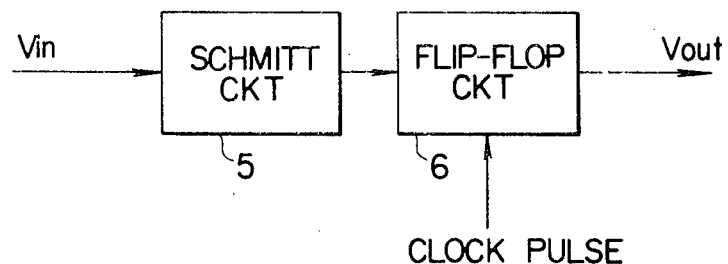

In FIG. 1 numeral 5 designates a Schmitt trigger circuit and 6 a clocked flip-flop circuit for which triggering (or writing) is effected by a clock pulse. As the clocked flip-flop circuit, there is employed with, for example, bipolar transistors, a flip-flop circuit of the master-slave type.

An asynchronous input signal $V_{in}$ having a long transition time is subjected to waveform shaping by the Schmitt circuit 5. More specifically, the Schmitt circuit 5 causes a sudden change in the output at a predetermined voltage (threshold voltage $V_{th}$), and this is known as a bistable multivibrator of the positive feedback type. Consequently, until the asynchronous input signal $V_{in}$ rises from 0 V to a certain voltage $V_{th1}$, the output of the Schmitt circuit 5 is at a first level, and when it exceeds the voltage $V_{th1}$, the output changes rapidly to a second level.

The situation is similar where the asynchronous input signal $V_{in}$ falls, and when it becomes lower than a prescribed voltage $V_{th2}$, the output of the Schmitt circuit changes rapidly from the second level to the first level.

Accordingly, square wave pulses which have good rising and falling characteristics are generated from the Schmitt circuit 5, and the transition time in which the state of the output shifts from the first level to the second level becomes extremely short in comparison with that of the input signal $V_{in}$.

Consequently, as compared with directly converting the asynchronous signal $V_{in}$ into a synchronous signal by the clocked flip-flop 6, the rate of malfunction becomes much smaller in converting it into the synchronous signal by the clocked flip-flop circuit after waveform shaping by the Schmitt trigger circuit.

In other words, the latter has a much smaller probability that signal levels lying in the transition region will be picked up, that is, the probability that the rising or falling part of the input waveform and the clock pulse will overlap.

Figure 2A:
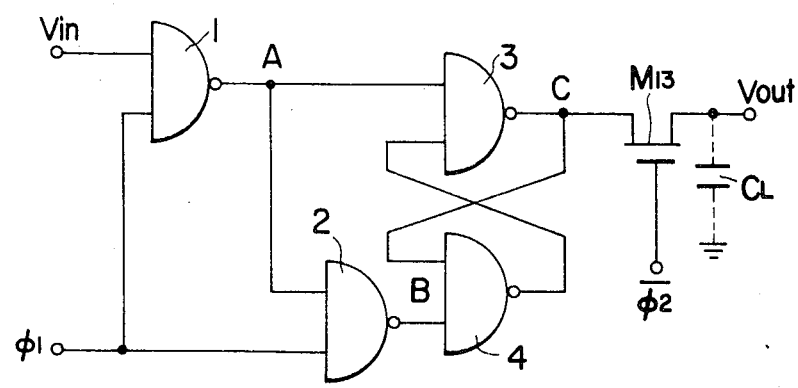

The synchronizer and converter circuits which cause a probability of 0 percent are shown in FIG. 2a.

In FIG. 2a, 1 – 4 are NAND gate circuits, $M_{13}$ is a transfer gate composed of an insulated gate field-effect transistor (MISFET), and $C_L$ is a load capacitor.

Figure 2B:
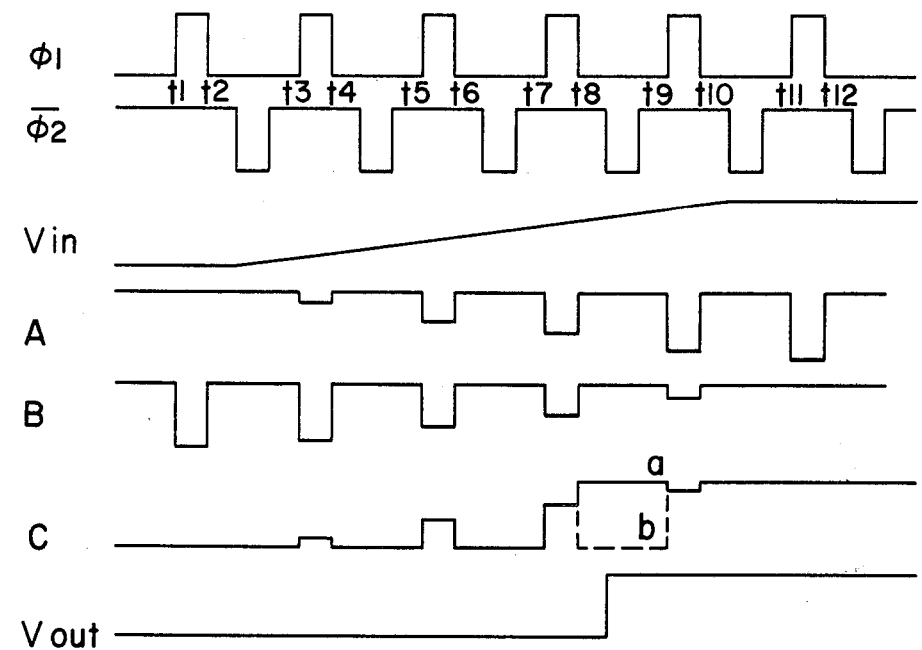

The NAND gates 3 and 4 constitute a flip-flop circuit, while the NAND gates 1 and 2 constitute an input circuit thereof. A clock pulse $\phi_1$, having a first phase as shown in FIG. 2b, is applied to one input terminal of each of the NAND gates 1 and 2, while the asynchronous input signal and the output signal A of the NAND gate 1 are applied to the other input terminals of the respective NAND gates. The transistor $M_{13}$ is driven by a clock pulse $\overline{\phi_2}$ having a second phase differing from the phase of clock pulse $\phi_1$.

Now, the operation of this circuit will be explained in conjunction with the time chart in FIG. 2b. In the figure, the upper level denotes a logical 1 (0 V), and the lower level denotes a logical 0 (negative potential).

As is also apparent from the figure, only when the clock pulse $\phi_1$ becomes 1 are the NAND gate circuits 1 and 2 enabled, to transmit the state of the asynchronous input signal $V_{in}$ to the output, and when clock pulse $\phi_1$ becomes 0, they are disabled and force the outputs to a 1.

Accordingly, when the clock pulse $\phi_1$ is a 1, the outputs of the NAND gates or the inputs A and B of the flip-flop become $\overline{V}_{in}$ and $\overline{\overline{V}}_{in}$ ($= V_{in}$), respectively.

Referring to FIG. 2b, the asynchronous input signal $V_{in}$ is a logic 0 level during period $t_1 - t_2$, so that the outputs A and B of the NAND gates 1 and 2 are at the determined levels 1 and 0, respectively. Since the input signal $V_{in}$ enters the transition region in and after a period $t_3 - t_4$ of the next clock pulse $\phi_1$, NAND gates 1 and 2 also operate in the transition region, and the respective outputs assume values intermediate the two predetermined digital levels. To the flip-flop, accordingly, the input signals of the intermediate levels enter in periods ($t_3 - t_4$, $t_5 - t_6$, $t_7 - t_8$, $t_9 - t_{10}$) of the clock pulse $\phi_1$, so that its output C also takes on values of the intermediate levels during these periods. During the subsequent periods ($t_1 - t_5$, $t_6 - t_7$, $t_8 - t_9$, $t_{10}$), however, both inputs A and B of the flip-flop become 1 by the clock pulse $\phi_1$, so that the state of the flip-flop is stabilized and the output C is set at either a logical 0 or 1 level.

To the input side of the flip-flop, complementary signals are applied by the NAND gates 1 and 2 during the periods of the clock pulse $\phi_1$, and the states of the output C of the flip-flop in the subsequent periods are determined by the relative magnitudes of the levels of the complementary signals. As a result, until any of the clock pulses $\phi_1$ appears after the in-rush of the asynchronous input signal $V_{in}$ to the transition region, for example, during the periods $t_4 - t_5$ and $t_6 - t_7$, the output C of the flip-flop remains unchanged at 0, and when the clock pulse $\phi_1$ appears next (the period $t_8 - t_9$), the state is inverted (becomes 1) for the first time. Even if, at this time, the relative magnitudes of the inputs A and B of the flip-flop are not in the relation of inverting the state of the flip-flop, they will eventually come into the relation of inverting them. When the relation of the relative magnitudes is close to the critical point of inverting the state of the flip-flop, the state of the flip-flop is inverted either prior to or subsequent to it. For example, in FIG. 2b, the output C becomes either a or b in the waveform.

While the operation has been explained above for the rising period of the asynchronous signal $V_{in}$, the operation is similar for the falling period.

Next, the output C of the flip-flop is written into the load storage capacitor $C_L$ by the transfer gate $M_{13}$, and the writing is carried out when no intermediate level appears in the output C, that is, when the clock pulse $\phi_1$ is not 1. In other words, the clock pulses $\phi_1$ and $\overline{\phi}_2$ differ in phase, and the output signal $V_{out}$ becomes a signal which does not have any value of the intermediate level and which is synchronized with the clock pulse $\overline{\phi}_2$.

Here, it will be understood that even when the transfer gate $M_{13}$ and the load capacitor $C_L$ are substituted by a flip-flop which is triggered by the clock pulse $\overline{\phi}_2$, the essential operation of this circuit does not vary.

The inputs A and B of the flip-flop may be so made that the complementary input signals enter thereto during the periods of the clock pulse $\phi_1$ and, hence, the inverted signal $\overline{V}_{in}$ of the asynchronous input signal $V_{in}$ and the clock pulse $\phi_1$, may also be applied to the two inputs of the NAND gate 2.

Figure 2C:
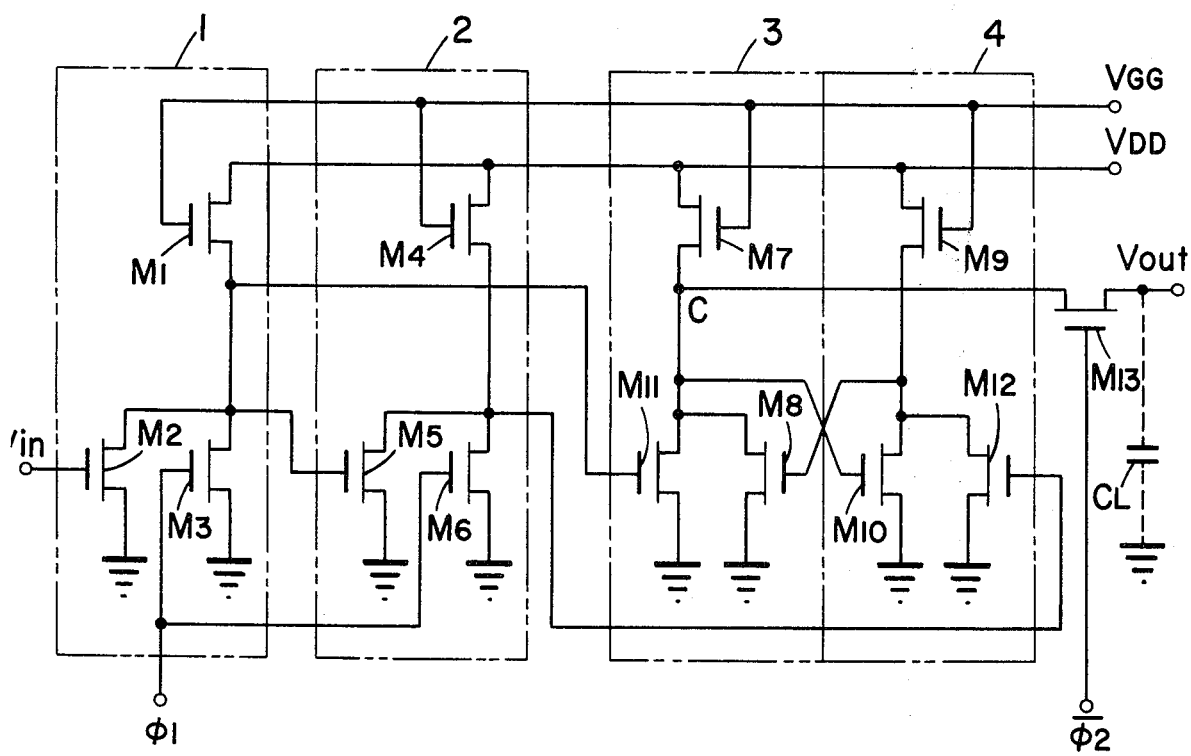

The circuit shown in FIG. 2a can be constructed of either bipolar transistors or unipolar transistors and both can be optionally selected as is necessary, but in the electronic desk calculator, the use of unipolar transistors is preferable for power consumption and degree of integration, as has been previously stated and, accordingly, an example thereof is shown in FIG. 2c.

If, in FIG. 2c, load transistors $M_1$ and $M_4$ are driven by a clock pulse $\phi_1$, the power consumption will be reduced. Load transistors $M_7$ and $M_9$ of the flip-flop, however, are preferably driven by DC.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A synchronizer circuit comprising:
    a first gate having a first input terminal for receiving a first clock pulse and a second input terminal for directly receiving an asynchronous input signal, the interval of time during which said asynchronous input signal travels between two prescribed levels being longer than the period of said first clock pulse;
    a second gate having a first input terminal for receiving said first clock pulse and a second input terminal for receiving an output of said first gate, said first and second gates being enabled in a first repeated interval by said first clock pulse;
    a flip-flop circuit having a first input terminal for receiving an output of said first gate and a second input terminal for receiving an output of said second gate; and
    means for reading out an output of said flip-flop circuit in a second repeated interval by a second clock pulse shifted in phase relative to said first clock pulse of opposite polarity and.

2. A synchronizer circuit according to claim 1, wherein each of said first and second gates is a NAND gate.

3. A synchronizer circuit according to claim 1, wherein said means comprises a field-effect transistor having source and drain electrodes, one of which is connected to the output terminal of said flip-flop circuit and from the other of which a synchronized waveform-shaped signal is derived, and a gate electrode for receiving said second clock pulse.

4. A synchronizer circuit according to claim 1, wherein each of said first and second clock pulses is of the same frequency.

\* \* \* \* \*